United States Patent
Shimizu et al.

(10) Patent No.: US 7,438,838 B2
(45) Date of Patent: Oct. 21, 2008

(54) POLYMERIC OPTICAL WAVEGUIDE-FORMING MASTER PLATE, METHOD FOR PRODUCING POLYMER OPTICAL WAVEGUIDE, AND APERTURE CHANGEABLE POLYMERIC OPTICAL WAVEGUIDE

(75) Inventors: Keishi Shimizu, Ashigarakami-gun (JP); Shigemi Ohtsu, Ashigarakami-gun (JP); Kazutoshi Yatsuda, Ashigarakami-gun (JP); Eiichi Akutsu, Ashigarakami-gun (JP)

(73) Assignee: Fuji Xerox Co., Ltd., Tokyo (JP)

( * ) Notice: Subject to any disclaimer, the term of this patent is extended or adjusted under 35 U.S.C. 154(b) by 889 days.

(21) Appl. No.: 10/796,057

(22) Filed: Mar. 10, 2004

(65) Prior Publication Data

US 2005/0018990 A1 Jan. 27, 2005

(30) Foreign Application Priority Data

Jul. 25, 2003 (JP) ............................. 2003-279742

(51) Int. Cl.
*B29D 11/00* (2006.01)
(52) U.S. Cl. ..................... 264/1.24; 264/497; 264/494
(58) Field of Classification Search ................. 264/1.24
See application file for complete search history.

(56) References Cited

U.S. PATENT DOCUMENTS 5,138,687 A * 8/1992 Horie et al. ................. 385/129
6,355,198 B1 3/2002 Kim et al.

FOREIGN PATENT DOCUMENTS

| JP | A-03-012612 | 1/1991 |
| JP | A 10-253845 | 9/1998 |
| JP | B2 3151364 | 1/2001 |

* cited by examiner

*Primary Examiner*—Monica A Huson
(74) *Attorney, Agent, or Firm*—Oliff & Berridge, PLC

(57) ABSTRACT

The invention relates to a method for producing a polymeric optical waveguide-forming master plate, comprising: laying a thread which does not transmit rays used for subsequent exposure on a substrate for a master plate, applying a positive resist material onto the substrate to have a thickness such that, when parallel rays are vertically radiated onto the resist from a side opposite to a substrate side with respect to the thread and then the resist is developed, a layer made of the resist is formed at whole space where the rays have not been radiated; radiating parallel rays substantially vertically to the substrate to expose the resist to the rays; and developing the exposed resist on the substrate to form a convex portion corresponding to a shape of an optical waveguide core, to waveguide production methods using the same, and to the resultant waveguide.

13 Claims, 5 Drawing Sheets

POLYMERIC OPTICAL WAVEGUIDE-FORMING MASTER PLATE, METHOD FOR PRODUCING POLYMER OPTICAL WAVEGUIDE, AND APERTURE CHANGEABLE POLYMERIC OPTICAL WAVEGUIDE

CROSS-REFERENCE TO RELATED APPLICATION

This application claims priority under 35 U.S.C. 119 from Japanese Patent Application No. 2003-279742, the disclosure of which is incorporated by reference herein.

BACKGROUND OF THE INVENTION

1. Field of the Invention

The present invention relates to a flexible polymeric optical waveguide-forming master plate, a method for producing a polymeric optical waveguide, and an aperture changeable polymeric optical waveguide (a polymeric optical waveguide with a changeable aperture).

2. Description of the Related Art

In producing a polymeric optical waveguide, the following methods have been proposed: (1) a method in which a film is impregnated with a monomer, and a core portion is selectively exposed to light so as to change the refractive index in the core portion, and the film is then laminated on a substrate (selective polymerization method), (2) a method in which a core layer and a clad layer are applied to a substrate, and then a clad portion is formed by using reactive ion etching (RIE method), (3) a method using a photolithographic method in which an ultraviolet ray-curable resin obtained by adding a photosensitive material to a polymer material is used, exposed to UV light and developed (direct exposure method), (4) a method using an injection molding and, (5) a method in which a core layer and a clad layer are applied to a substrate and then a core portion is exposed to light so as to change the refractive index of the core portion (photo-bleaching method). However, the selective polymerization method (1) has a problem in lamination of the films. Methods (2) and (3) are expensive since a photolithographic method is used. Method (4) has a problem in accuracy of a core diameter. Method (5) has a problem in that a sufficient refractive index difference cannot be obtained. At present, only methods (2) and (3) are practical methods for providing waveguides with high performance. However, none of these methods are suitable for the formation of a polymeric optical waveguide on a flexible substrate having a large area.

David Hart of Sharp Corp. has proposed a method for producing a polymeric optical waveguide in which a pattern substrate with a groove pattern which is to be a capillary is brought into close contact with a plane substrate by using a clamping jig, and the capillary is filled with a monomer solution under a reduced pressure (see Japanese Patent No. 3151364). However, this method has a drawback in that, unless the clamp is used to bring the pattern substrate into close contact with the plane substrate, the monomer solution also enters portions other than the core and therefore a precise waveguide structure cannot be formed. This method has another drawback in that the volume of the monomer solution changes when undergoing polymerization to form a macromolecule (solidification), leading to change in a core shape. Moreover, still another drawback is that the core shape collapses at the time of removal of the capillary because a polymer obtained by the polymerization of the monomer solution partially adheres to the capillary.

Recently, George M. Whitesides et al. of Harvard University has proposed a method called "capillary micro-mold" as one of soft liqhographic methods in new technologies for making a nano-structure. In this method, a master substrate is produced by using photolithography, the nano-structure of the master substrate is exactly copied on a mold of a polydimethylsiloxane (PDMS) by utilizing the adhesiveness and easy separability of the PDMS, and a liquid polymer is infused into the mold by utilizing capillarity and solidified. The detail thereof is described in SCIENTIFIC AMERICAN September 2001 (Nikkei Science, December 2001 issue). Moreover, a patent about the capillary micro-mold method was granted to Kim Enoch et al., from the group of George M. Whitesides, of Harvard University (see U.S. Pat. No. 6,355,198). However, in the case of a concave portion to be filled having a small sectional area such as the core of an optical waveguide, the production process described in this patent is unsuitable for mass-production since a long period of time is required to fill the concave portion (to form a core). This process also has a drawback in that the volume of a monomer solution changes when the monomer solution is reacted and solidified into a polymer, causing change in a core shape.

Meanwhile, if the aperture of an optical waveguide can be changed in accordance with the size of the various optical fibers, light-emitting elements or light-receiving elements, coupling loss can be reduced. However, in conventional methods, a typical example of which is the direct exposure method using photolithography, it is difficult to change the thickness of the resultant film continuously. Accordingly, the aperture of the core cannot be controlled at will to reduce coupling loss. Moreover, a method of finely processing a silicon substrate by FIB or the like is known. However, the method has a problem in that a huge number of steps are required to produce an optical waveguide having a large aperture and a large area, such as a multimode optical waveguide, and such steps are substantially impossible to conduct.

As an attempt for overcoming the above-mentioned problem, a method for pouring a UV curable resin into a mold to form a an aperture changeable polymeric optical waveguide has been proposed (see Japanese Patent Application Laid-Open (JP-A) No. 10-253845). In this method, a polymer liquid for forming a core is put into a very shallow tank whose depths continuously change from one end thereof to the other end thereof, and a polymeric waveguide with apertures which change in the longitudinal direction of the waveguide is formed by making use of the depth difference of the tank. It is therefore necessary to dispose the tank just parallel to a gravitational direction. Moreover, this process is susceptible to vibration. Thus, the process is not practical as a process for mass production. Furthermore, this publication never describes a specific process for making a groove having a satisfactory surface roughness and shape precision which an optical waveguide is required to have and having thicknesses and widths which change in the longitudinal direction thereof.

Accordingly, there is a demand for a process for inexpensively and simply producing a polymeric optical waveguide-forming master plate.

There is also a demand for a process for inexpensively and simply producing a polymeric optical waveguide.

There is also a need for an aperture changeable polymeric optical waveguide having apertures which change at the both ends thereof in accordance with the sizes of various optical elements.

SUMMARY OF THE INVENTION

A first aspect of the invention provides a method for producing a polymeric optical waveguide-forming master plate, comprising: laying a thread which does not transmit rays used for subsequent exposure on a substrate for a master plate, applying a positive resist material onto the substrate for the master plate to have a thickness such that, when parallel rays are vertically radiated onto the positive resist material from a side opposite to a substrate side with respect to the thread and then the positive resist material is developed, a layer made of the positive resist material is formed at whole space where the rays have not been radiated; radiating parallel rays substantially vertically to the substrate for the master plate to expose the positive resist material to the rays; and developing the exposed positive resist material on the substrate for the master plate to form a convex portion corresponding to a shape of an optical waveguide core.

A second aspect of the invention provides a method for producing a polymeric optical waveguide, comprising: preparing a mold having a concave portion for forming an waveguide core, the concave portion having a cross-section which has a shape in which a semicircle or a semiellipse is combined with a rectangle; bringing a clad substrate into close contact with the mold so that the concave portion faces the clad substrate; filling the concave portion of the mold brought into close contact with the clad substrate with a core-forming curable resin; and curing the core-forming curable resin to form a core.

A third aspect of the invention provides a method for producing a polymeric optical waveguide, comprising: preparing a polymeric optical waveguide-forming master plate, the polymeric optical waveguide-forming master plate having a convex portion which corresponds to an waveguide core and, as an outer layer thereof, a metal coating, the convex portion having a cross-section which has a shape in which a semicircle or a semiellipse is combined with a rectangle; applying a clad-forming curable resin onto a clad substrate to form a resin layer; pushing the convex portion of the polymeric optical waveguide-forming master plate against the resin layer; curing the resin layer to form a cured resin layer having a concave portion corresponding to the convex portion of the polymeric optical waveguide-forming master plate; separating the polymeric optical waveguide-forming master plate from the cured resin layer; filling the concave portion of the cured resin layer with a core-forming curable resin; curing the core-forming curable resin to form a core; and forming a clad layer on a surface of the clad substrate having the core.

A fourth aspect of the invention provides an aperture changeable polymeric optical waveguide, comprising an optical waveguide core having cross-sections in which a semicircle or a semiellipse is combined with a rectangle, and a portion whose sectional areas change continuously in a longitudinal direction of the core.

According to the invention, laying a fibrous thread, and exposing a resist to light and developing the resist, which are inexpensive, are combined with each other, thereby providing a process for inexpensively and simply producing a polymeric optical waveguide-forming master plate.

Moreover, the invention can provide a process for inexpensively and simply producing a polymeric optical waveguide.

Furthermore, the invention can provide an aperture changeable polymeric optical waveguide which can be adapted to various optical elements having different sizes.

BRIEF DESCRIPTION OF THE DRAWINGS

FIGS. 3C, 3F, 3I, 3J, and 3O are back views illustrating the outline of a method for producing a polymeric optical waveguide according to the first embodiment of the invention.

DETAILED DESCRIPTION OF THE INVENTION

Figure 1A:
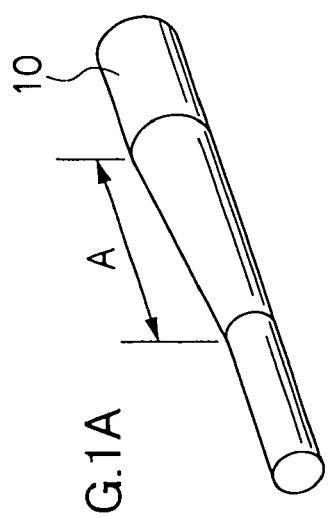
FIGS. 1A to 1E are perspective views illustrating the outline of a method for producing a polymeric optical waveguide-forming master plate of the invention.

First, the process for producing a polymeric optical waveguide-forming master plate of the invention is described.

Process for Producing Polymeric Optical Waveguide-Forming Master Plate

The process for producing a polymeric optical waveguide-forming master plate of the invention comprises: laying a thread which does not transmit rays used for subsequent exposure on a substrate for a master plate, applying a positive resist material onto the substrate for the master plate to have a thickness such that, when parallel rays are vertically radiated onto the positive resist material from a side opposite to a substrate side with respect to the thread and then the positive resist material is developed, a layer made of the positive resist material is formed at whole space where the rays have not been radiated; radiating parallel rays substantially vertically to the substrate for the master plate to expose the positive resist material to the rays; and developing the exposed positive resist material on the substrate for the master plate to form a convex portion corresponding to a shape of an optical waveguide core.

A fibrous thread is first prepared. The surface roughness thereof is preferably several ten nanometers or less since the fibrous thread will constitute the main portion of the sectional shape of a core. Since the thread itself functions as a photomask, it is necessary that the material of the thread does not transmit rays used for subsequent exposure. The rays used for exposure are preferably ultraviolet rays. When an ordinary glass fiber is used as the thread, a thin film capable of blocking ultraviolet rays is applied onto the surface of the fiber. Unless the thin film has adverse influence on the surface roughness, the thin film may be made of any material. The thin film may be, for example, made of a dye, or produced by plating of chromium or electroless plating of nickel.

The glass fiber is preferable since it can easily have a tapered form in which sectional areas of the fiber are different from each other in the longitudinal direction of the fiber by heating and drawing.

Next, the prepared thread is laid on a substrate for a master plate. That is, the thread is arranged at a predetermined position on the substrate. In order to precisely conduct the positioning, it is preferable to use the substrate which has V-shaped grooves. In this case, however, it is necessary that the V-shaped grooves are made outside a position at which a core is to be formed later. This is because the transferring of the shape of the V-shaped grooves into a mold (i.e., an optical waveguide-forming mold) has adverse influence on the shape of an optical waveguide to be formed. In order to precisely lay the thread, a robot having an NC control system can be used in place of V-shaped grooves. In this case, it is necessary to bond the thread to the substrate. A simple method for this bonding is a method including: applying a positive resist material, which will be described later, in advance and using the resist material as it is as a bonding layer. Another method for the bonding is a method using the thin film for blocking ultraviolet rays as a bonding layer.

The method of applying a positive resist material on the substrate for a master plate is described. It is necessary that the applied positive resist material has a thickness such that, when the positive resist material is exposed to light and developed, especially when parallel rays are vertically radiated onto the applied resist material from a side opposite to a substrate side with respect to the thread and the material is developed, a layer made of the positive resist material is formed in whole space where the rays have not been irradiated (space just under the thread). In other words, the applied layer has a thickness equal to or thicker than a height from the substrate surface to the middle of the largest portion 10B of the thread in a vertical direction. This is because, at the time of forming a convex portion pattern corresponding to a core, a restriction is imposed on the sectional shape of the layer. Since the formed product is used as a master plate, it is necessary that the layer has a shape such that a mold which is made with the master plate can be separated from the master plate. If a thread having a circular cross-section is used as it is as a convex portion, a mold-forming curable resin enters the space between the thread and the substrate for a master plate. It is therefore almost impossible to separate the resultant mold from the master plate. To prevent this, it is preferable to fill the gap between the thread and the substrate with the positive resist material. In order to attain this, when a thread having a circular cross-section, such as a glass fiber, is used, the positive resist material is applied to the substrate such that the applied layer has at least the above-mentioned thickness which enables the gap between the thread and the substrate for the master plate to be filled with the resist material. In this state, when the positive resist material is exposed to light and developed, especially when parallel rays are vertically radiated onto the material from a side opposite to a substrate side with respect to the thread and subsequently the material is developed, a layer made of the positive resist material is formed in whole space where the rays have not been irradiated and the layer has a shape which can be used as a mold.

As the method for the application, a widely known method such as spin coating or dip coating can be used. Even if the film thickness is somewhat large, no particular problem is caused in the invention. The applied layer may have a thickness such that it hides the whole of the laid thread.

Next, rays are radiated onto the substrate for the master plate onto which substrate the positive resist material is applied as described above to expose the resin material to the rays. The rays are preferably ultraviolet rays. At this time, in order to radiate the ultraviolet rays vertically to the substrate for the master plate, it is necessary that the ultraviolet rays are parallel to each other. When the resist material is exposed to the rays in this way, only the portion of the applied positive resist material layer which portion is disposed between the thread and the substrate for the master plate is not exposed. The positive resist material in the whole of the other portions is exposed. The maximum resist thickness and the time of the exposure are determined on the basis of the characteristics of the positive resist material.

After the completion of the exposure, the exposed resist layer is developed and washed. Thus, a convex portion which has a sectional shape such that the gap between the thread and the substrate for the master plate is filled with the resist layer and which corresponds to a core shape is formed. According to this method, convex portions having various sectional shapes can be formed. For example, when the thread is spaced apart from the substrate such that the distances therebetween are changed, a convex portion having heights which continuously change in the longitudinal direction of the convex portion can be formed. Moreover, when a glass fiber which has been heated and drawn to have a tapered form is used as the thread, a convex portion having heights and widths which continuously change can be formed.

Figure 1B:
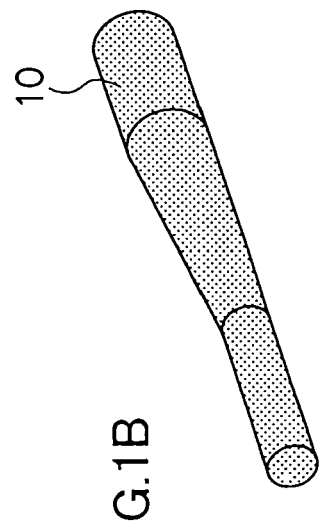
Figure 1C:
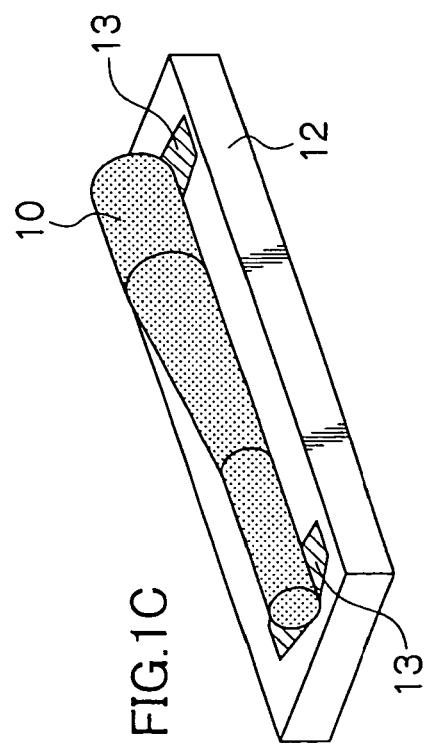
Figure 1D:
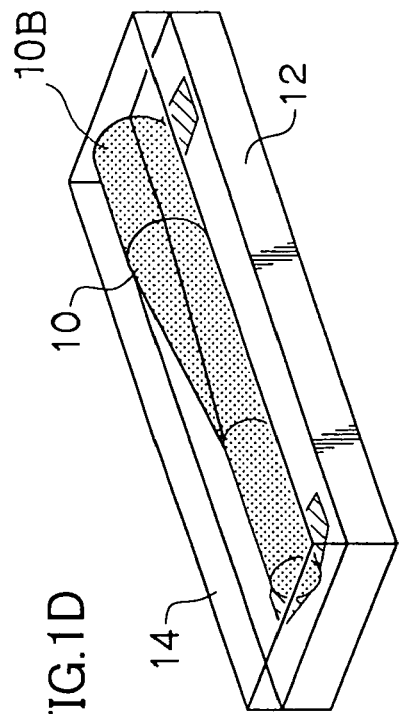
Figure 1E:
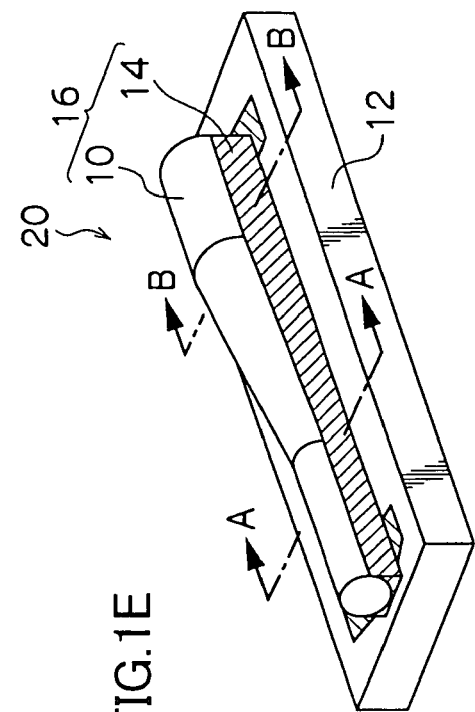
Figure 2A:
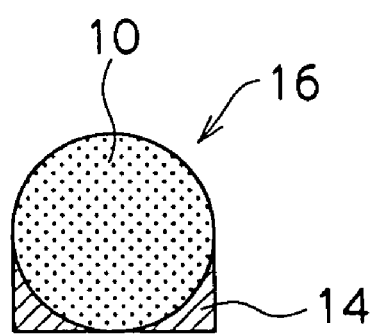
FIGS. 2A and 2B are sectional views of the convex portion of the master plate, taken along line A-A and line B-B of FIG. 1E.
Figure 2B:
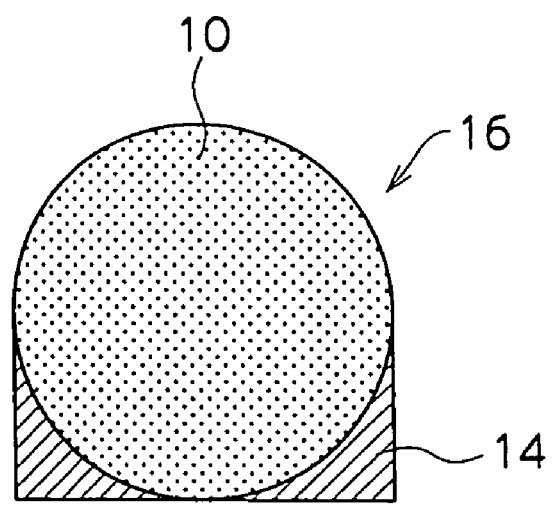

With reference to the drawings, the process of the invention is described hereinafter. FIGS. 1A to 1E are schematic views illustrating an embodiment of the process for producing a polymeric optical waveguide-forming master plate of the invention. FIG. 1A illustrates a thread 10 made of a glass fiber. The thread 10 has a tapered form wherein the sectional areas of a portion A in FIG. 1A change continuously. The thread 10 is electroless-plated to prepare a thread which can block ultraviolet rays (FIG. 1B). Subsequently, the electroless-plated thread 10 is positioned with V-shaped grooves 13 made in a substrate 12 for a master plate, laid on the substrate 12, and then bonded to the substrate 12 (FIG. 1C) A positive resist material 14 is applied onto the substrate 12 for the master plate to have at least a thickness such that, when parallel rays are vertically radiated onto the resist material 14 from a side opposite to a substrate side with respect to the thread 10 and then the resist material 14 is developed, a layer made of the resist material is formed in whole space where the rays have not been radiated (FIG. 1D). Next, parallel ultraviolet rays are radiated substantially vertically to the substrate 12 to expose the positive resist material 14 to the rays. The resultant is developed and washed. Thus, a polymeric optical waveguide-forming master plate 20 in which a convex portion 16 is formed on the substrate 12 is obtained as illustrated in FIG. 1E. FIGS. 2A and 2B are sectional views of the convex portion 16, taken along line A-A and line B-B of FIG. 1E. As illustrated in FIGS. 2A and 2B, only the portion of the positive resist material 14 which portion is disposed between the thread 10 and the substrate 12 has been cured.

A mold made of a silicone elastomer can easily be formed with the thus prepared polymeric optical waveguide-forming master plate. Additionally, this master plate can be used as a stamper for a stamper process. In this case, however, it is necessary that a convex portion has sufficient strength. Therefore, it is preferable to conduct electroforming at least twice, or conduct combination of electroforming and mold-replication by use of a silicone rubber to produce a polymeric optical waveguide-forming master plate which has a shape corresponding to the convex portion and has metal coating.

Method for Producing Polymeric Optical Waveguide

The method for producing a polymeric optical waveguide of the invention is described hereinafter. The first embodiment of this process comprises: preparing a mold having a concave portion for forming an waveguide core, the concave portion having a cross-section which has a shape in which a semicircle or a semiellipse is combined with a rectangle; bringing a clad substrate into close contact with the mold so that the concave portion faces the clad substrate; filling the concave portion of the mold brought into close contact with the clad substrate with a core-forming curable resin; and curing the core-forming curable resin to form a core.

Figure 3A:
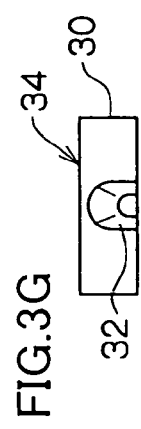
FIGS. 3A, 3D, 3G, 3J, and 3M are front views
Figure 3B:
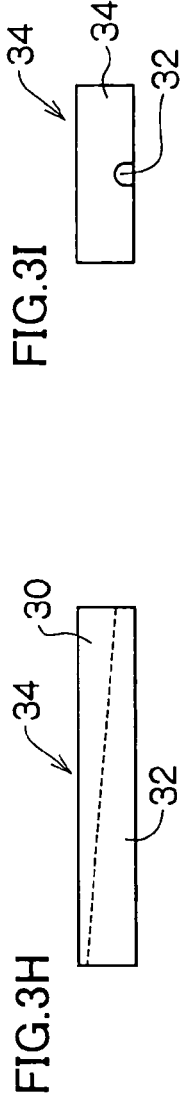
FIGS. 3B, 3E, 3H, 3K and 3N are side views
Figure 3C:
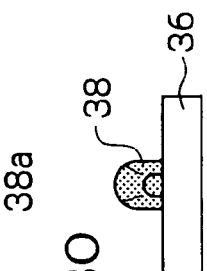
Figure 3D:
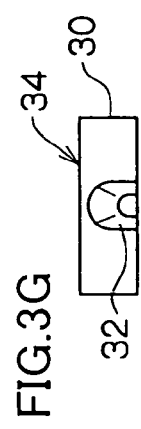
Figure 3E:
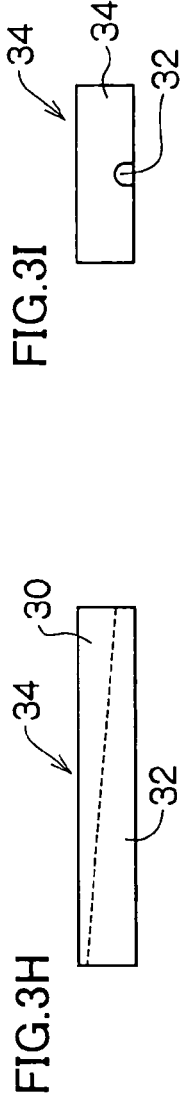
Figure 3F:
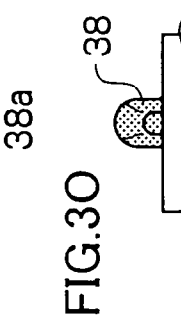
Figure 3G:
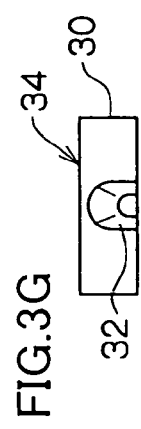
Figure 3H:
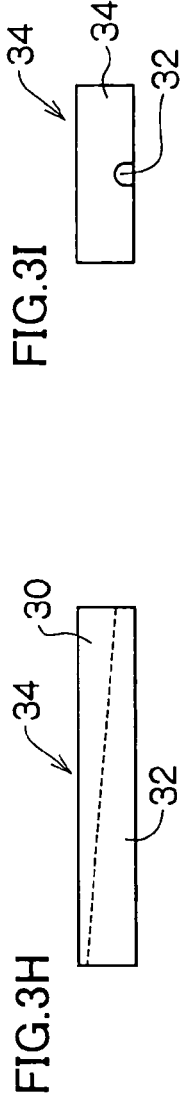
Figure 3I:
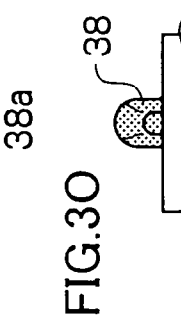
Figure 3J:
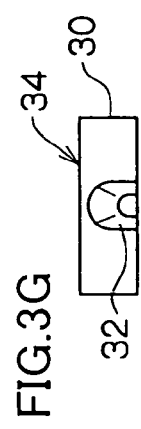
Figure 3K:
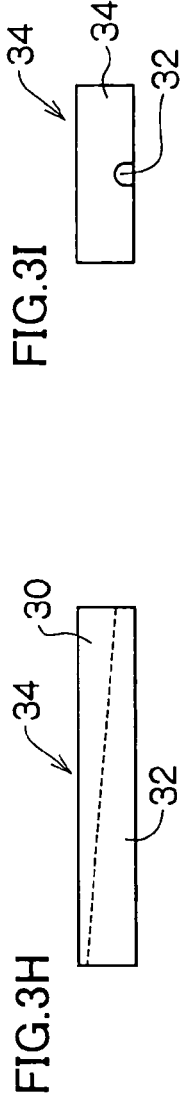
Figure 3L:
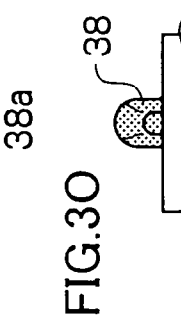
Figure 3M:
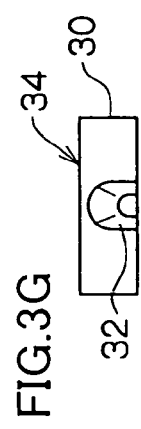
Figure 3N:
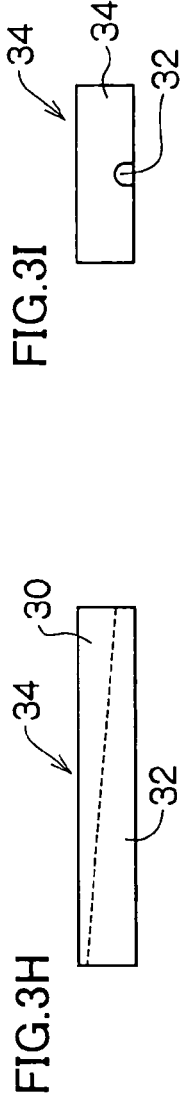
Figure 3O:
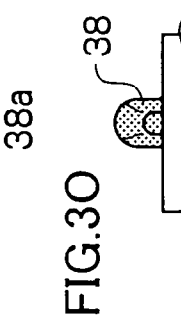

The outline of mold production and subsequent steps are shown in FIGS. 3A to 3O. FIG. 3A is a front view of the polymeric optical waveguide-forming master plate, and FIG. 3C is a back view thereof, and FIG. 3B is a side view when the master plate shown in FIG. 3A is viewed from the right side thereof. The same relationship is applied to each group of FIGS. 3D to 3F, FIGS. 3G to 3I, FIGS. 3J to 3L, and FIGS. 3M to 3O.

FIGS. 3A to 3C illustrate a polymeric optical waveguide-forming master plate 20 wherein the convex portion 16 having sectional areas which are different from each other in the longitudinal direction of the convex portion and corresponding to a core is formed on the substrate 12 for the master plate. As illustrated in FIGS. 3D to 3F, a cured layer 30 made of a mold-forming curable resin is first formed on the surface of the master plate 20 having the convex portion 16. Next, the cured layer 30 is separated from the master plate 20, and then both ends thereof are cut to expose a concave portion 32, thereby forming a mold 34 (see FIGS. 3G to 3I).

A clad substrate 36 is brought into close contact with the thus-formed mold 34 so that the concave portion 32 faces the clad substrate 36 (see FIGS. 3J to 3L). Next, the whole of one end of the concave portion 32 is brought into contact with a core-forming curable resin 38a which is to be a core, and the air is sucked from the other end to introduce the core-forming curable resin 38a into the concave portion 32 of the mold 34. Thereafter, the core-forming curable resin in the concave portion 32 is cured and then the mold 34 is separated from a product in which a core is formed on the clad substrate 36 (these steps are not illustrated). As a result, the product in which the convex portion (core) 38 of an optical waveguide is formed on the clad substrate 36 can be obtained. Thereafter, a clad layer is formed on the surface of the clad substrate having the core, and the both ends of the resultant are cut.

Mold preparation and subsequent steps of the above method is described in detail hereinafter.

Preparation of Mold

First, a mold is prepared. The mold has a concave portion for forming an waveguide core, and the concave portion has a cross-section which has a shape in which a semicircle or a semiellipse is combined with a rectangle. The concave portion can have sectional areas which continuously change in the longitudinal direction thereof. The mold can be prepared by using a polymeric optical waveguide-forming master plate. The polymeric optical waveguide-forming master plate used in this method can be produced by the method for producing a polymeric optical waveguide-forming master plate described above, and description thereof is omitted.

Specifically, the mold is produced by applying or injecting a mold-forming curable resin onto the surface of the polymeric optical waveguide-forming master plate (produced above) having the convex portion corresponding to the core, optionally drying the resultant curable resin layer, curing the resin, and separating the cured resin layer from the master plate. The mold has an inlet from which the mold-forming curable resin is introduced to the concave portion corresponding to the convex portion to fill the concave portion with the mold-forming curable resin, and an outlet from which the mold-forming curable resin in the concave portion is discharged. The method for forming the inlet and outlet is not particularly limited. The polymeric optical waveguide-forming master plate having convex portions corresponding to the inlet and outlet can be used. However, the inlet and outlet can be simply produced by, for example, forming a cured resin layer made of the mold-forming curable resin on the master plate, separating the resultant layer from the master plate to prepare a mold precursor, and cutting both ends of the mold precursor to expose the concave portion and to prepare a mold.

It is effective that the mold has through-holes communicating with the concave portion of the mold at both ends of the concave portion. The through-hole communicating with the inlet can be used as a liquid (resin) reservoir. The through-hole communicating with the outlet is useful for connecting the inside of the concave portion to a pressure-reducing suction apparatus by inserting the pressure-reducing suction tube of the apparatus into the through-hole. When the mold has plural concave portions, a through-hole may be formed with respect to each of the concave portions in accordance with the pitch of the concave portions. Alternatively, one through-hole with which the concave portions disposed on the same side of the mold communicate may be made.

The thickness of the cured resin layer may be appropriately determined in consideration of the handling property of the resultant mold. In general, the thickness is from about 0.1 to about 50 mm.

It is preferable to facilitate the separation of the master plate from the mold by conducting a releasing treatment such as application of a releasing agent.

The mold-forming curable resin preferably has the following natures: the cured product made therefrom can be easily separated from the master plate; the cured product has a sufficient mechanical strength and a sufficient dimensional stability that a mold, which is repeatedly used, is required to have; the cured product has a sufficient hardness to keep the shape of the concave portion; and the cured product has a strong adhesiveness to a clad substrate. Various additives may be added to the resin, if necessary.

The mold-forming curable resin preferably has a viscosity not more than a certain limit which viscosity enables application or injection of the mold-forming curable resin onto the surface of the polymeric optical waveguide-forming master plate and precise copying of the convex portions of the master plate corresponding to the individual cores. For example, the viscosity of the resin is preferably about 500 to 7000 mPa's. (Examples of the "mold-forming curable resin" used in the invention include resins that are cured to form a rubbery product which has elasticity.) A solvent for adjusting the viscosity may be added to the resin to such an extent that adverse influence is not produced by the solvent.

The mold-forming curable resin is preferably a curable organopolysiloxane which is cured to form a silicone rubber (silicone elastomer) or a silicon resin from the viewpoints of separability, mechanical strength, dimensional stability, hardness and adhesiveness thereof to the clad substrate as described above. The curable organopolysiloxane preferably has in the molecule thereof a methylsiloxane group, an ethylsiloxane group or a phenylsiloxane group. The curable organopolysiloxane may be a one-component type or a two-component type in which the organopolysiloxane is used in combination with a hardener. The curable organopolysiloxane may be a thermosetting type or a curable type which is cured at room temperature (for example, one which is cured with moisture in air). The curable organopolysiloxane may be those which are cured by other methods (such as ultraviolet ray curing).

The curable organopolysiloxane is preferably one which is cured to form a silicone rubber. A rubber which is usually called a liquid silicone rubber is used as such. (Examples of the "liquid" rubber include silicone rubbers having a high viscosity, such as a pasty silicone rubber). The liquid silicone rubber is preferably a two-component type. In particular, an addition type liquid silicone rubber is preferable for the following reasons: the rubber can be cured for a short period of time so that the surface and the inside thereof are uniformly cured; byproducts are never or hardly generated; and the rubber has an excellent separability and a small shrinkage percentage.

The oligomer or monomer of the curable silicone rubber or the curable silicone resin preferably has a methylsiloxane group, an ethylsiloxane group or a phenylsiloxane group. A curable dimethylsiloxane rubber oligomer (PDMS) is particularly preferable from the viewpoints of adhesiveness and separability thereof. Since the cured PDMS product generally has a low refractive index of about 1.43, a mold made from PDMS can be used as it is as a clad layer without separating the mold from the clad substrate. In this case, it is necessary to adopt a measure for preventing the PDMS mold from separating from the infused core-forming resin and the clad substrate.

The liquid silicone rubber preferably has a viscosity of 500 to 700 mPa's, and more preferably 2000 to 5000 mPa's in order to copy the convex portion corresponding to the optical waveguide core to be formed, simplify deforming due to decrease in incorporation of bubbles into the rubber, and form a mold having a thickness of several millimeters.

The surface energy of the mold is preferably from 10 to 30 dyn/cm, and preferably 15 to 24 dyn/cm from the viewpoints of adhesiveness between the substrate film and the mold and the penetration speed of the core-forming curable resin.

The Share rubber hardness of the mold is preferably from 15 to 80, and preferably from 20 to 60 from the viewpoints of the precise copying property of the convex portion, maintenance of the shape of the concave portion and separability thereof.

The surface roughness (root mean square roughness (RMS)) of the mold is usually 0.5 μm or less, preferably 0.1 μm or less, and more preferably 0.05 μm or less in order to remarkably reduce an optical loss which is one of the optical waveguide characteristics of the formed core.

It is preferable that the mold has light-transmissibility within the ultraviolet ray range and/or the visible range. The reason why it is preferable that the mold has light-transmissibility within the visible range is that, when the mold is brought into close contact with a clad substrate, the positioning thereof can easily be conducted, and that the state in which the concave portion of the mold is being filled with a core-forming curable resin can be observed, and that the completion of the filling can easily be checked. The reason why it is preferable that the mold has light-transmissibility within the ultraviolet ray range is that, when an ultraviolet ray-curable resin is used as the core-forming curable resin, ultraviolet rays can be irradiated to the ultraviolet ray-curable resin through the mold to cure the resin. It is preferable that the transmittance of the mold is 80% or more in the ultraviolet ray range (wavelengths of 250 to 400 nm).

The curable organopolysiloxane, particularly the liquid silicone rubber which is cured to form a silicone rubber has excellent adhesiveness thereof to the clad substrate and excellent separability thereof from the clad substrate, which are in conflict with each other, and the capability of copying a nano-structure, and, when the silicone rubber is brought into close contact with the clad substrate, prevents even invasion of liquid. Since the mold made of such a silicone rubber can copy the master plate and can be brought into close contact with the clad substrate, only space formed by the concave portion of the mold and the clad substrate can be efficiently filled with a core-forming resin. Furthermore, the mold can be easily separated from the clad substrate. Accordingly, a polymeric optical waveguide having a highly precise core shape can be very simply produced with the mold.

A part of the cured resin layer (particularly, the cured resin layer having rubbery elasticity), that is, a portion other than the portion for copying the convex portion of the master plate, can be replaced with a different rigid material. In this case, the handling property of the mold is improved.

Bringing Clad Substrate into Close Contact with Mold

The type of the clad substrate used in the invention is not limited, and examples thereof include a glass substrate, a ceramic substrate, and a plastic substrate. A product wherein such a substrate is coated with a resin to control the refractive index may be used. The refractive index of the clad substrate is preferably less than 1.55, and more preferably less than 1.50. It is necessary that the refractive index of the clad substrate is smaller than that of the core material by 0.05 or more. The clad substrate is preferably flat and has excellent adhesiveness to the mold so that, when the clad substrate is brought into close contact with the mold, no gap but the concave portion of the mold is generated. When the adhesiveness of the clad substrate to the mold and/or the core is not very strong, it is preferable to conduct a treatment in an ozone atmosphere or a treatment radiating ultraviolet rays which have wavelengths of 300 nm or less to improve the adhesiveness of the clad substrate to the mold or the core.

A polymeric optical waveguide having a flexible film substrate, out of various plastic substrates, can also be used as optical wiring between couplers or boards, or a demultiplexer. The film substrate is selected on the basis of the use of the polymeric optical waveguide to be produced in consideration of the optical properties thereof (such as a refractive index and light-transmissibility thereof), mechanical strength, heat resistance, adhesiveness thereof to the mold, and flexibility thereof.

Examples of the material of the film substrate include acrylic resins (such as polymethyl methacrylate), alicyclic acrylic resins, styrene resins (such as polystyrene, an acrylonitrile/styrene copolymer), olefin resins (such as polyethylene, polypropylene, and an ethylene/propylene copolymer), alicyclic olefin resins, vinyl chloride resins, vinylidene chloride resins, vinyl alcohol resins, vinylbutyral resins, arylate resins, fluorine-containing resins, polyester resins (such as polyethylene terephthalate, and polyethylene naphthalate), polycarbonate resins, cellulose di- or tri-acetate, amide resins (such as aliphatic, and aromatic polyamides), imide resins, sulfone resins, polyethersulfone resins, polyether ether ketone resins, polyphenylenesulfide resins, polyoxymethylene resins, and blends thereof.

When the adhesiveness of the film substrate to the mold and/or the core is not very strong, it is preferable to conduct a treatment in an ozone atmosphere or a treatment radiating ultraviolet rays which have wavelengths of 300 nm or less to improve the adhesiveness thereof to the mold or the core.

Examples of the alicyclic acrylic resin include OZ-1000, and OZ-1100 (manufactured by Hitachi Chemical Co., Ltd.), wherein an alicyclic hydrocarbon such as tricyclodecane is introduced into an ester substituent.

Examples of the alicyclic olefin resin include resins having in the main chain thereof a norbornene structure, and resins having in the main chain a norbornene structure and also having in the side chains thereof polar groups such as alkyloxycarbonyl groups (the alkyl group thereof being an alkyl group having 1 to 6 carbon atoms, or a cycloalkyl group). In particular, the alicyclic olefin resins having in the main chain a norbornene structure and also having in the side chains thereof polar groups such as alkyloxycarbonyl groups have excellent optical properties, such as a low refractive index (of about 1.50, which provides a sufficient difference between the refractive index of the core and that of the clad), and a high light transmissibility; excellent adhesiveness thereof to the mold; and excellent heat resistance. Accordingly, these resins are particularly suitable for producing the polymeric optical waveguide of the invention.

The refractive index of the film substrate is preferably less than 1.55, and more desirably less than 1.53 in order to obtain a sufficient difference between the refractive index of the substrate and that of the core.

The thickness of the film substrate is suitably selected in consideration of flexibility, rigidity, and easy handling thereof. In general, the thickness is preferably from about 0.1 to 0.5 mm.

Filling Concave Portion of Mold Brought into Close Contact with Clad Substrate with Core-Forming Curable Resin Filling the concave portion of the mold with a core-forming curable resin can be conducted by bringing the clad substrate which is larger than the mold into close contact with the mold, dropping down a small amount of the core-forming curable resin into the inlet of the concave portion to fill the concave portion with the resin by capillarity, or by introducing the resin into the concave portion under an applied pressure, or by sucking the air from the outlet of the concave portion to accelerate the filling, or by introducing the resin into the concave portion under an applied pressure while the air is sucked from the outlet of the concave portion. When the through-holes are provided at ends of the concave portion as described above, it is possible to store the resin in the through-hole communicating with the inlet and fill the concave portion with the resin under an applied pressure, and/or insert a pressure-reducing suction tube connected to a pump into the through-hole communicating with the outlet and then sucking the air in the concave portion via the pump.

When the application of pressure and the suction of the air are conducted together, it is preferable to synchronously conduct them. It is further preferable that the applied pressure is preferably increased step by step in the filling under the pressure while the pressure is decreased step by step in the suction of the air in order to attain conflicting purposes, namely to stably fix the mold and to inject the core-forming curable resin at a higher speed.

As the core-forming curable resin, radioactive ray-curable, electron beam-curable, ultraviolet ray-curable, thermosetting, and other curable resins can be used. The ultraviolet ray-curable and thermosetting resins are particularly preferable.

A preferable example of the core-forming ultraviolet ray-curable or thermosetting resin is an ultraviolet ray-curable or thermosetting monomer or oligomer, or a mixture of the monomer and the oligomer.

Preferable examples of the ultraviolet ray-curable resin include epoxy, polyimide and acrylic ultraviolet ray-curable resins.

It is necessary that the core-forming curable resin has a sufficiently low viscosity to enable the filling of the space formed by the clad substrate and the concave portion of the mold therewith. The viscosity of the curable resin is preferably from 10 to 2000 mPa's, more preferably from 100 to 1000 mPa's, and even more preferably from 300 to 700 mPa's from the viewpoints of a resin-introducing speed, a precise core shape, and small optical loss.

In order to highly precisely reproduce the original shape of the convex portion of the master plate corresponding to the optical waveguide core, it is also necessary that the difference between the volume of the curable resin before curing and that of the cured curable resin is small. For example, decrease in the volume causes guided wave loss. Accordingly, it is preferable that the above difference is as small as possible. The volume change percentage is preferably 10% or less, and more preferably from 0.01 to 4%. Use of a solvent to decrease the viscosity of the coating solution containing the curable resin is not preferable since the difference increases. Therefore, when the core-forming curable resin has a sufficiently low viscosity, it is preferable to avoid the use of the solvent.

In order to decrease the above difference (shrinkage), a polymer may be added to the resin. The polymer preferably has compatibility with the core-forming curable resin and has no adverse impact on the refractive index, elasticity and transmissibility of the resin. The addition of the polymer makes it possible to not only decrease the above difference but also precisely control the viscosity or the glass transition point of the curable resin. The polymer may be, for example, an acrylic polymer, a methacrylic acid polymer or an epoxy polymer, but is not limited thereto.

The refractive index of the cured product of the core-forming curable resin is preferably in the range of from 1.20 to 1.60, and more preferably from 1.4 to 1.6. Two or more resins which form cured products having different refractive indexes within this range when cured may be used.

It is necessary that the refractive index of the cured product of the core-forming curable resin is larger than that of a clad including the film substrate serving as the clad substrate and a clad layer which will be described later. The difference between the refractive index of the core and that of the clad (the clad substrate and the clad layer) is 0.001 or more, and preferably 0.03 or more.

In order to accelerate the filling of the concave portion of the mold with the core-forming curable resin by capillarity, it is preferable to reduce the pressure of the whole system to about 0.1 to 100 kPa.

To accelerate the filling, it is also effective to heat the core-forming curing resin introduced from the inlet of the mold to reduce the viscosity thereof.

Curing Core-Forming Curable Resin

The introduced core-forming curable resin is cured. To cure an ultraviolet ray-curable resin, an ultraviolet ray lamp, an ultraviolet ray LED, an UV radiating apparatus or the like is used. To set a thermosetting resin, the resin is heated in an oven or the like.

Separating Mold from Clad Substrate with Formed Core

Next, the mold is separated from the clad substrate. However, the mold may be used as it is as a clad layer, if the mold satisfies requirements including a low refractive index. In this case, it is unnecessary to separate the mold from the clad substrate. In order to improve the adhesiveness between the mold and the core material in this case, it is preferable to treat the mold with ozone.

Forming Clad Layer on Clad Substrate with Formed Core

A clad layer is formed on the surface of the clad substrate having the formed core. Examples of the clad layer include a film (e.g., those used as the clad substrate), a layer obtained by applying a clad-forming curable resin and curing the resin, and a polymer membrane obtained by applying the solution in which a polymer material is dissolved in a solvent and then drying the coating. The clad-forming curable resin is preferably an ultraviolet ray-curable resin or a thermosetting resin.

An ultraviolet ray-curable or thermosetting monomer or oligomer, or a mixture of the monomer and the oligomer is used as such.

In order to decrease the change (shrinkage)ratio of the volume of the cured clad-forming curable resin to that of the clad-forming curable resin before curing, a polymer may be added to the resin. The polymer (such as a methacrylic or an epoxy polymer) preferably has compatibility with the clad-forming curable resin and has no adverse influence on the refractive index, elasticity and transmissibility of the clad-forming curable resin.

When a film is used as the clad layer, the film is adhered to the clad substrate by use of an adhesive. In this case, it is preferable that the refractive index of the adhesive is close to that of the film. The used adhesive is preferably an ultraviolet ray-curable resin or a thermosetting resin. An ultraviolet ray-curable or thermosetting monomer or oligomer, or a mixture of the monomer and the oligomer is used as such.

To decrease the above volume change (shrinkage) of the cured ultraviolet ray-curable resin or thermosetting resin to the volume of the resin before curing, the same polymer as that added to the clad layer may be added to the adhesive.

The difference between the refractive index of the clad substrate and that of the clad layer is preferably as small as possible, and is preferably 0.01 or less, more preferably 0.001 or less, and even more preferably zero in order to confine light in the core.

In the process for producing a polymeric optical waveguide of the invention, a combination of, as a mold-forming curable resin, a liquid silicone rubber which forms a rubbery form when cured (particularly, a liquid dimethylsiloxane rubber), and, as a clad substrate, an alicyclic olefin resin having in the main chain thereof a norbornene structure and also having in side chains thereof polar groups such as alkyloxycarbonyl groups has particularly high adhesiveness therebetween, and can form a concave portion which does not transform, and, even if a concave portion has a very small sectional area (for example, a square concave portion having an edge of 10 micrometers), quickly fill the concave portion with the curable resin.

The second embodiment of the process for producing a polymeric optical waveguide of the invention is described hereinafter. The second embodiment comprises: preparing a polymeric optical waveguide-forming master plate, the polymeric optical waveguide-forming master plate having a convex portion which corresponds to an waveguide core and, as an outer layer thereof, a metal coating, the convex portion having a cross-section which has a shape in which a semicircle or a semiellipse is combined with a rectangle; applying a clad-forming curable resin onto a clad substrate to form a resin layer; pushing the convex portion of the polymeric optical waveguide-forming master plate against the resin layer; curing the resin layer to form a cured resin layer having a concave portion corresponding to the convex portion of the polymeric optical waveguide-forming master plate; separating the polymeric optical waveguide-forming master plate from the cured resin layer; filling the concave portion of the cured resin layer with a core-forming curable resin; curing the core-forming curable resin to form a core; and forming a clad layer on a surface of the clad substrate having the core.

In the second embodiment of the production method of the invention, a stamper having metal coating and having a shape corresponding to the convex portion of the master plate is prepared by electroforming at least once the polymeric optical waveguide-forming master plate, and then a polymeric optical waveguide is produced with the resultant stamper by a stamper method.

Figure 4A:
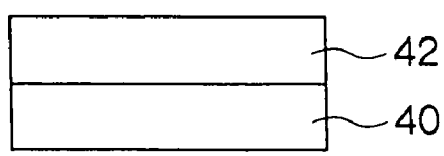
FIGS. 4A to 4E are side views illustrating the outline of a method for producing a polymeric optical waveguide according to the second embodiment of the invention.
Figure 4B:
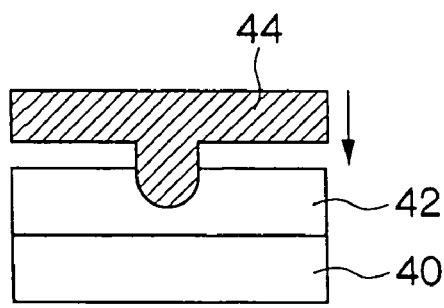
Figure 4C:
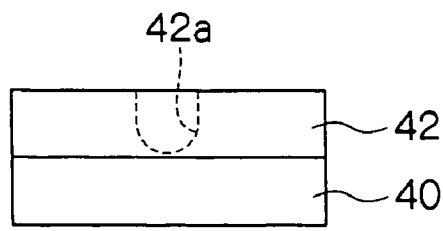
Figure 4D:
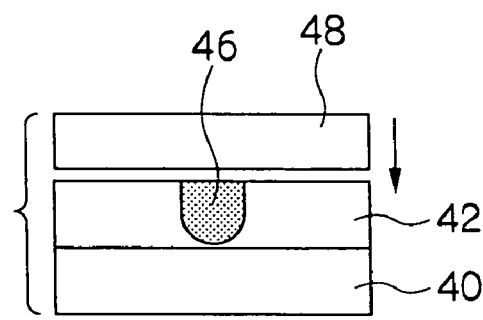
Figure 4E:
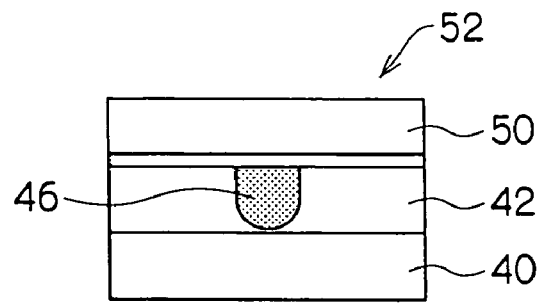

Hereinafter, the outline of the second embodiment of the invention is described with reference to FIGS. 4A to 4E. First, a clad-forming curable resin is applied onto a clad substrate 40 to form a clad-forming curable resin layer 42 (FIG. 4A). Next, a polymeric optical waveguide-forming master plate 44 having metal coating and prepared by electroforming twice a master plate precursor which has been prepared in the same manner as the preparation of the polymeric optical waveguide-forming master plate obtained by the method illustrated in FIGS. 1A to 1E is pushed against the clad-forming resin layer 42 (FIG. 4B). Next, the clad-forming curable resin layer 42 is cured and then the polymeric optical waveguide-forming master plate 44 is removed from the cured clad-forming curable resin layer 42 to form a concave portion 42a corresponding to the convex portion of the master plate 44 (FIG. 4C). The concave portion 42a is filled with a core-forming curable resin 46, and then a glass plate 48 is put on the cured clad-forming curable resin layer 42 (FIG. 4D). Next, the core-forming curable resin 46 is cured and the glass plate 48 is removed from the cured clad-forming curable resin layer. A clad layer 50 is formed on the cured clad-forming curable resin layer 42. In this way, a polymeric optical waveguide 52 is formed (FIG. 4E). The clad-forming curable resin is an ultraviolet ray curable resin or a thermosetting resin which is the same as those described in the formation of a clad layer in the first embodiment. The clad layer is the same as those described in the formation of a clad layer. The core-forming curable resin is the same as those described in the first embodiment.

Aperture Changeable Polymeric Optical Waveguide

An aperture changeable polymeric optical waveguide of the invention is described hereinafter.

This optical waveguide has an optical waveguide core. The optical waveguide core has cross-sections which are cut along a plane perpendicular to the longitudinal direction of the waveguide and whose upper shape is a semicircle or a semiellipse and whose lower shape is a rectangle. Moreover, the optical waveguide core has a portion whose sectional areas cut along the plane change continuously in the longitudinal direction of the core. The aperture changeable polymeric optical waveguide of the invention can be adapted to various optical elements having different sizes.

Figure 5A:
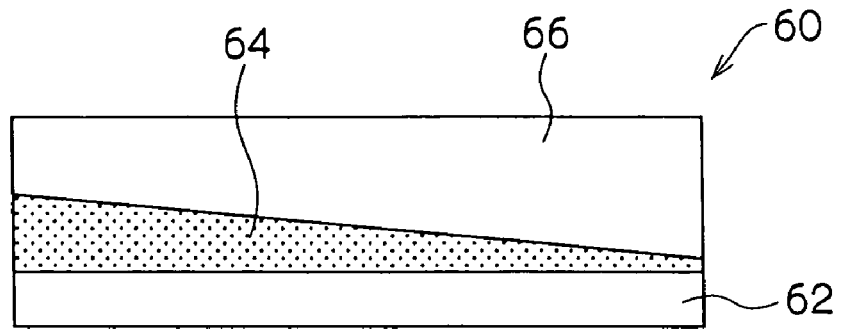
FIGS. 5A and 5B are a side view and a sectional view illustrating an embodiment of the aperture changeable optical waveguide of the invention, respectively.
Figure 5B:
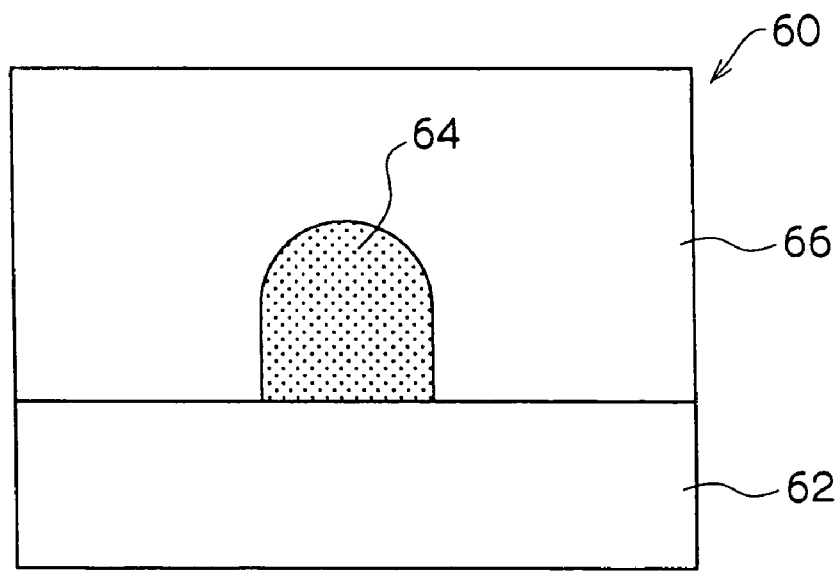

FIGS. 5A and 5B are views illustrating an embodiment of the an aperture changeable polymeric optical waveguide of the invention, and FIG. 5B is a front view thereof, and FIG. 5A is a side perspective view when the optical waveguide shown in FIG. 5B is viewed from the right side thereof. The aperture changeable polymeric optical waveguide illustrated in FIGS. 5A and 5B has a clad substrate 62, an optical waveguide core 64 formed on the clad substrate 62, and a clad layer 66 formed on the clad substrate 62. As illustrated in FIG. 5A, the sectional areas of the optical waveguide core 64 change continuously in the longitudinal direction thereof. The upper shape of the cross-section is a semicircle, and the lower shape thereof is a rectangle.

The aperture changeable polymeric optical waveguide of the invention can easily be produced by the method for producing a polymeric optical waveguide of the invention.

Figure 6:
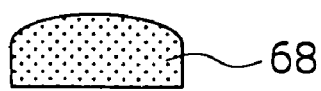
FIG. 6 is a sectional view illustrating a core having a shape in which a semielliptic upper portion and a rectangular lower portion are combined with each other.

The sectional shape of the optical waveguide core of the polymeric optical waveguide is generally rectangular. However, in the production method of the aperture changeable polymeric optical waveguide-forming master plate of the invention, it is difficult to draw the thread for blocking ultraviolet rays so that its corners remain. Therefore, the optical waveguide produced by the method of the invention has a sectional shape in which a rectangle is combined with a semicircle, as illustrated in FIGS. 5A and 5B. The radiation loss of the optical waveguide having such a shape is similar to that having a rectangular cross-section. Moreover, such an aperture changeable optical waveguide has an advantage in that it can easily be produced, as described above. When a thread having a semielliptic sectional shape is used to produce a polymeric optical waveguide-forming master plate and the master plate is used to produce an aperture changeable optical waveguide, the optical waveguide may have a cross-section in which the upper shape is a semiellipse and the lower shape is a rectangle. FIG. 6 illustrates the core of such an optical waveguide 68. Such an optical waveguide also has performance equivalent to that of an optical waveguide having a rectangular sectional shape.

EXAMPLES

The present invention is more specifically described with reference to the following examples. However, the invention is not limited by the examples.

Example 1

A glass fiber having a diameter of 200 μm is heated and drawn to prepare a tapered fiber (thread) having a tapered portion which has a length of 50 mm and a diameter of 200 μm at one end and a diameter of 100 μm at the other end. The surface of the glass is subjected to electroless plating to coat it with a nickel thin film for blocking ultraviolet rays. A glass substrate having a thickness of 1 mm is prepared, and then the tapered fiber is fixed on the glass substrate at both end portions thereof with an adhesive. Next, a positive thick film resist (THB-611P, manufactured by JSR Corp.) is applied onto the glass substrate by spin coating or dip coating so as to have a thickness of 100 μm. The thick film resist is pre-beaked and parallel rays are radiated vertically to the glass substrate from an ultraviolet ray-emitting apparatus. The resultant is developed with a TMAH developing solution, post-beaked and then washed. As a result, only the tapered fiber and the thick film resist beneath the fiber remain. This convex portion on the glass substrate corresponds to a tapered optical waveguide core, the aperture of which is narrowed from 200 μm to 100 μm (see FIGS. 1A to 1E). As described above, a polymeric optical waveguide-forming mater plate is produced.

Next, the master plate is coated with a releasing agent, and then PDMS (SYLGARD 184, manufactured by Dow Corning Asia Co.) is poured into the master plate. The resultant is heated at 120° C. for 30 minutes to solidify the PDMS, and then separated from the master plate to form a mold precursor having a thickness of 5 mm and a concave portion with a tapered portion.

A through-hole having a diameter of 3 mm and serving as a resin outlet is punched at a portion which is outward from one end of the tapered portion by 10 mm in the mold precursor. The mold is brought into contact with an Arton film (clad substrate). As a result, the two are brought into close contact with each other. In this state, an epoxy ultraviolet ray curable resin (manufactured by NTT-AT Co.) having a viscosity of 800 mPa's is dropped down onto the other end of the tapered portion of the mold while the air is sucked from the resin outlet at 20 Kpa. About five minutes later, the whole of the cavity has been filled with the resin.

Next, in this state, UV rays having an energy of 50 mW/cm$^2$ are radiated onto the mold to solidify the resin. The mold is separated from the master plate. Thus, a core having a refractive index of 1.58 is formed on the Arton film. At this time, the mold can be easily separated. Thereafter, an ultraviolet ray-curable resin having a refractive index of 1.51, which is the same as that of the Arton film, is applied onto the core, and another Arton film (clad layer) is laminated on the surface of the clad substrate to which surface the ultraviolet ray-curable resin has been applied. UV rays having an energy of 50 mW/cm$^2$ are radiated onto the resultant for 10 minutes to solidify the resin. Furthermore, both ends of the resultant are cut by a dicing saw to complete an aperture changeable optical waveguide having a sectional shape in which a semicircle is combined with a rectangle. The insertion loss thereof is 3 dB.

Example 2

An aperture changeable optical waveguide array is prepared in the same manner as in Example 1, except that a substrate for a master plate, which has at one end thereof four V-shaped grooves formed at a pitch of 2 mm and has at the other end thereof four V-shaped grooves formed at a pitch of 250 μm, is used, and that four tapered fibers (threads) used in Example 1 are adhered to the master plate so that one end of each fiber having an aperture of 200 μm is disposed at the 2 mm pitch side and the other end of each fiber having an aperture of 100 μm is disposed at the 100 μm pitch side. The 100 μm aperture side of the resultant waveguide array is connected to a 1×4 PD array which has an aperture of 100 μm and light-receiving areas having a pitch of 250 μm. The other side of the waveguide array is connected to a POF having an aperture of 200 μm. As a result, PD light-receiving can be attained with loss of about 3 db which is calculated based on light quantity from the POF end.

Example 3

An aperture changeable optical waveguide is prepared in the same manner as in Example 1, except that a master plate precursor is produced in the same manner as the preparation of the polymeric optical waveguide-forming master plate in Example 1, and that the surface of the master plate precursor is subjected to electroforming in which electroless plating is first conducted and nickel electroplating is then conducted to yield a polymeric optical waveguide-forming master plate having a convex portion corresponding to an optical waveguide core and nickel coating, and that the master plate is used to produce another mold made of PDMS. The insertion loss thereof is equal to that of the optical waveguide produced in Example 1, and collapse of a core shape which may be caused by copying is hardly observed.

Example 4

An Arton film having a thickness of 188 μm is spin-coated with a thermosetting resin (clad-forming curable resin) (manufactured by NTT-AT Co.) having a refractive index of 1.51 to form a resin layer having a thickness of 200 μm. A silicone oil as a releasing agent is very thinly applied onto the polymeric optical waveguide-forming nickel master plate produced in Example 3. The convex portion of the master plate is pushed against the thermosetting resin layer. In this state, the resultant is heated at 120° C. for 30 minutes to cured the thermosetting resin. Thereafter, the master plate is separated from the thermosetting resin layer to make a concave portion of the resin corresponding to a core whose apertures change in the longitudinal direction thereof, on the Arton film. A core-forming ultraviolet ray curable resin which is the same as that in Example 1 and has a refractive index of 1.58 is dropped down into this concave portion. A glass substrate coated with a silicone oil serving as a releasing agent is pushed against the concave portion to uniformly fill the whole of the portion which is to be a core with the core-forming ultraviolet ray curable resin.

In this state, UV rays having an energy of 50 mW/cm$^2$ are radiated onto the resultant for 10 minutes to solidify the resin. The glass substrate is separated from the cured resin layer to form a core having a refractive index of 1.58 onto the Arton film. After the glass substrate is separated, another Arton film is laminated onto the surface of the formed core. UV rays having an energy of 50 mW/cm$^2$ are radiated onto the resultant for 10 minutes to solidify the resin. Furthermore, both ends of the resultant are cut by a dicing saw to complete an aperture changeable optical waveguide having a sectional shape in which a semicircle is combined with a rectangle. The insertion loss thereof is 4 dB.

This method makes it possible to produce an aperture changeable optical waveguide without using a mold made of PDSM.

Example 5

An aperture changeable optical waveguide is produced in the same manner as in Example 1, except that a copper thread which has the same shape as that of the glass fiber is used instead of the glass fiber. As a result, the performance of the resultant optical waveguide is substantially equal to that of the optical waveguide in Example 1.

What is claimed is:

1. A method for producing a polymeric optical waveguide-forming master plate, comprising:
   laying a thread which does not transmit rays used for subsequent exposure on a substrate for a master plate,
   applying a positive resist material onto the substrate for the master plate to have a thickness such that, when parallel rays are vertically radiated onto the positive resist material from a side opposite to a substrate side with respect to the thread and then the positive resist material is developed, a layer made of the positive resist material is formed at whole space where the rays have not been radiated;
   radiating parallel rays substantially vertically to the substrate for the master plate to expose the positive resist material to the rays; and
   developing the exposed positive resist material on the substrate for the master plate to form a convex portion corresponding to a shape of an optical waveguide core.

2. A method for producing a polymeric optical waveguide-forming master plate according to claim 1, wherein the positive resist material is an ultraviolet ray-curable resin and the rays used for exposure are ultraviolet rays.

3. A method for producing a polymeric optical waveguide-forming master plate according to claim 1, wherein sectional areas of the thread change continuously in a longitudinal direction of the thread.

4. A method for producing a polymeric optical waveguide-forming master plate according to claim 1, wherein the substrate for the master plate has V-shaped grooves for positioning the thread.

5. A method for producing a polymeric optical waveguide-forming master plate according to claim 1, further comprising: electroforming at least once the substrate for the master plate having the formed convex portion.

6. A method for producing a polymeric optical waveguide, comprising:
   preparing a mold having a concave portion for forming a waveguide core, the concave portion having a cross-section which has a shape in which a semicircle or a semiellipse is combined with a rectangle;
   bringing a clad substrate into contact with the mold so that the concave portion faces the clad substrate;
   filling the concave portion of the mold after the mold has been brought into contact with the clad substrate with a core-forming curable resin; and
   curing the core-forming curable resin to form a core.

7. A method for producing a polymeric optical waveguide according to claim 6, wherein the concave portion has a tapered portion whose sectional areas change in a longitudinal direction of the concave portion.

8. A method for producing a polymeric optical waveguide comprising:
   preparing a mold having a concave portion for forming a waveguide core, the concave portion having a cross-section which has a shape in which a semicircle or a semiellipse is combined with a rectangle;
   bringing a clad substrate into close contact with the mold so that the concave portion faces the clad substrate;
   filling the concave portion of the mold brought into close contact with the clad substrate with a core-forming curable resin; and
   curing the core-forming curable resin to form a core;
   wherein the mold is prepared by applying a mold-forming curable resin onto a polymeric optical waveguide-forming master plate produced by a method of claim 1; curing the resin; and separating the cured resin layer from the polymeric optical waveguide-forming master plate.

9. A method for producing a polymeric optical waveguide according to claim 6, further comprising:
   separating the mold from the clad substrate with the core; and
   forming a clad layer on a surface of the clad substrate having the core.

10. A method for producing a polymeric optical waveguide, comprising:
    preparing a polymeric optical waveguide-forming master plate, the polymeric optical waveguide-forming master plate having a convex portion which corresponds to a waveguide core and, as an outer layer thereof, a metal coating, the convex portion having a cross-section which has a shape in which a semicircle or a semiellipse is combined with a rectangle;
    applying a clad-forming curable resin onto a clad substrate to form a resin layer;
    pushing the convex portion of the polymeric optical waveguide-forming master plate against the resin layer;
    curing the resin layer to form a cured resin layer having a concave portion corresponding to the convex portion of the polymeric optical waveguide-forming master plate;
    separating the polymeric optical waveguide-forming master plate from the cured resin layer;
    filling the concave portion of the cured resin layer with a core-forming curable resin;
    curing the core-forming curable resin to form a core; and
    forming a clad layer on a surface of the clad substrate having the core.

11. A method for producing a polymeric optical waveguide according to claim 10, wherein the convex portion has a tapered portion whose sectional areas change in a longitudinal direction of the convex portion.

12. A method for producing a polymeric optical waveguide according to claim 10, wherein the polymeric optical waveguide-forming master plate is produced by a method comprising:

laying a thread which does not transmit rays used for subsequent exposure on a substrate for a master plate, applying a positive resist material onto the substrate for the master plate to have a thickness such that, when parallel rays are vertically radiated onto the positive resist material from a side opposite to a substrate side with respect to the thread and then the positive resist material is developed, a layer made of the positive resist material is formed at whole space where the rays have not been radiated;

radiating parallel rays substantially vertically to the substrate for the master plate to expose the positive resist material to the rays;

developing the exposed positive resist material on the substrate for the master plate to form a convex portion corresponding to a shape of an optical waveguide core; and electroforming at least once the substrate for the master plate having the formed convex portion.

13. A method for producing a polymeric optical waveguide-forming master plate according to claim 1, wherein at least some of the positive resist material remaining after the developing step is disposed in a space between the thread and the master plate.

\* \* \* \* \*